(12) United States Patent
Zhan et al.

(10) Patent No.: US 10,199,342 B2
(45) Date of Patent: Feb. 5, 2019

(54) RELIABLE PAD INTERCONNECTS

(71) Applicant: GLOBALFOUNDRIES Singapore Pte. Ltd., Singapore (SG)

(72) Inventors: Xiaohua Zhan, Singapore (SG); Xinfu Liu, Singapore (SG); Yoke Leng Lim, Singapore (SG); Siow Lee Chwa, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 15/412,067

(22) Filed: Jan. 23, 2017

(65) Prior Publication Data

US 2018/0211927 A1 Jul. 26, 2018

(51) Int. Cl.
*H01L 23/00* (2006.01)
*H01L 21/768* (2006.01)
(Continued)

(52) U.S. Cl.
CPC .......... *H01L 24/05* (2013.01); *H01L 21/0217* (2013.01); *H01L 21/02164* (2013.01);
(Continued)

(58) Field of Classification Search
CPC ............. H01L 2924/014; H01L 23/481; H01L 23/5384; H01L 24/49; H01L 21/76877; H01L 21/76885; H01L 25/50; H01L 21/486; H01L 21/768; H01L 21/7685; H01L 2223/54486; H01L 2224/02126; H01L 2224/02372; H01L 2224/04026; H01L 2224/04042; H01L 2224/04105; H01L 2224/05017; H01L 2224/05018; H01L 2224/05548; H01L 2224/40137; H01L 2224/48227; H01L 2224/48228; H01L 2224/48245; H01L 2224/48247; H01L 2224/85048; H01L 2225/06513; H01L 2225/06517; H01L 2225/06524;
(Continued)

(56) References Cited

U.S. PATENT DOCUMENTS

| 5,668,055 | A | * | 9/1997 | Xu | ..................... H01L 21/76877 |
| | | | | | 257/E21.585 |
| 6,656,828 | B1 | * | 12/2003 | Maitani | ............. H01L 21/76843 |
| | | | | | 257/E21.508 |
| 2005/0037609 | A1 | * | 2/2005 | Nakatani | ........... H01L 21/76846 |
| | | | | | 438/637 |

* cited by examiner

*Primary Examiner* — Sonya D. McCall-Shepard
(74) *Attorney, Agent, or Firm* — Horizon IP Pte Ltd.

(57) ABSTRACT

A device and methods of forming the device are disclosed. A substrate with a circuits component and a dielectric layer with interconnects is provided. A pad level dielectric layer is formed over the dielectric layer. A primary passivation layer is formed over the pad level dielectric layer with pad interconnects. The substrate is subjected to an alloying process. During the alloying process, the primary passivation layer prevents or reduces formation of hillocks on surfaces of the pad interconnects to improve surface smoothness of the pad interconnects. Pad openings are formed in the pad level dielectric layer to expose top surfaces of the pad interconnects. A cap dielectric layer is formed on the substrate and lines the primary passivation layer as well as the exposed top surfaces of the pad interconnects. A final passivation layer is formed on the substrate and covers the cap dielectric layer. The final passivation layer is patterned to form final passivation openings corresponding to the pad openings.

20 Claims, 10 Drawing Sheets

(51) Int. Cl.
 *H01L 21/02* (2006.01)
 *H01L 23/498* (2006.01)
 *H01L 23/31* (2006.01)

(52) U.S. Cl.
 CPC .. *H01L 21/76813* (2013.01); *H01L 21/76883* (2013.01); *H01L 23/3171* (2013.01); *H01L 23/49822* (2013.01); *H01L 23/49827* (2013.01); *H01L 23/49838* (2013.01); *H01L 24/03* (2013.01); *H01L 2224/05026* (2013.01); *H01L 2224/05147* (2013.01)

(58) Field of Classification Search
 CPC ... H01L 2225/06541; H01L 2225/1058; H01L 22/32; H01L 23/13; H01L 23/147; H01L 23/3171; H01L 23/5386; H01L 24/04; H01L 24/94; H01L 25/042; H01L 25/0652; H01L 2924/14; H01L 21/76831; H01L 23/5226; H01L 23/53295
 See application file for complete search history.

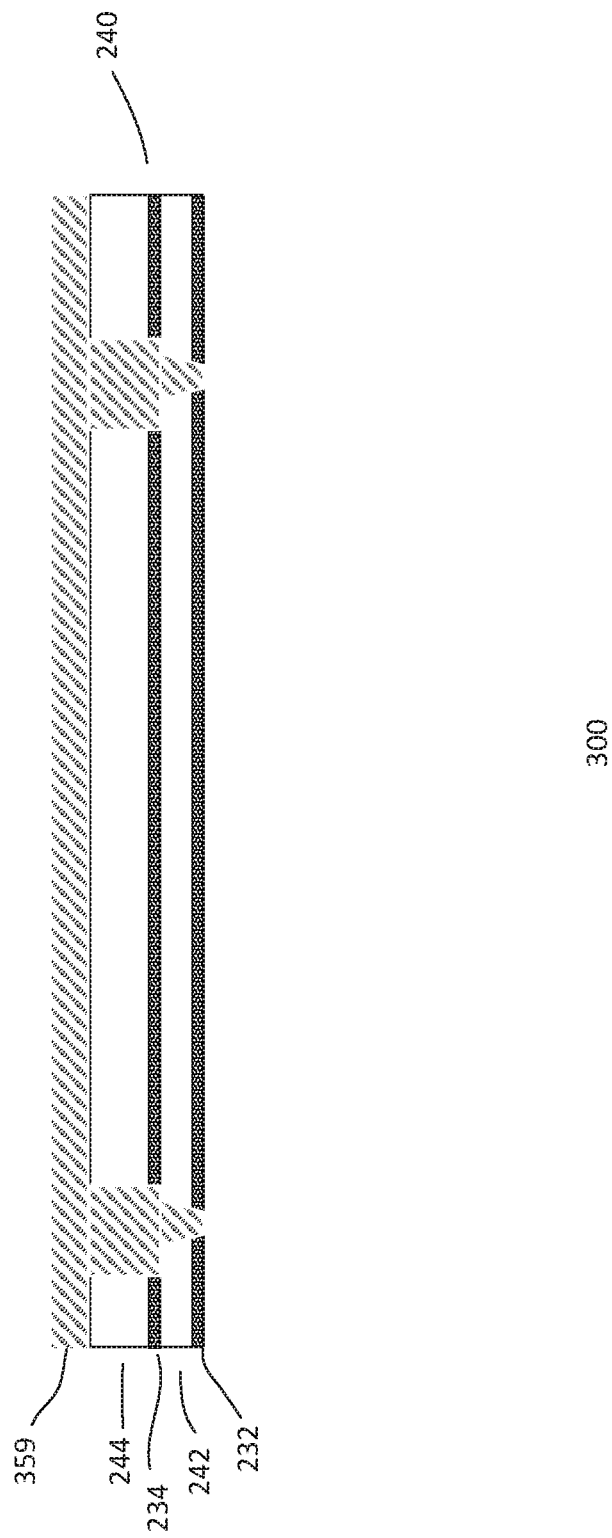

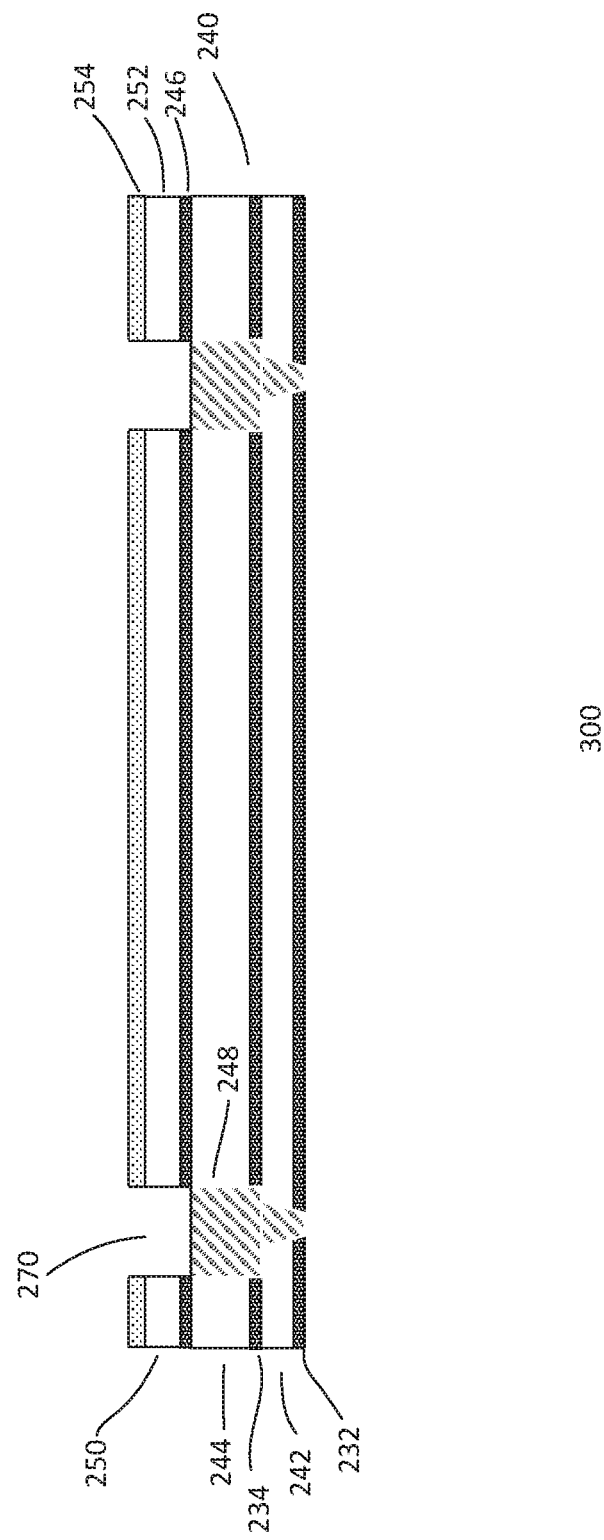

RELIABLE PAD INTERCONNECTS

BACKGROUND

In semiconductor device fabrication, back-end-of-line (BEOL) wafer processing generally involves creating various interconnecting metal layers that may be interconnected by vias. Pads are connected to the interconnects. The pads provide external electrical connection to internal components of an integrated circuit (IC) to other ICs or electronic devices. The pads may be used for wire bonding or bumping in the case of wafer level packaging.

In conventional processing, the pads are subject to high temperature processes, such as alloying process. Such high temperature processes cause hillocks to form on the surfaces of the bonding pads. The hillock increases surface roughness, which negatively impact bonding reliability and package integrity of the device.

The present disclosure relates to providing more reliable bonding pad with improved surface smoothness over conventional bonding pads.

SUMMARY

Embodiments of the present disclosure generally relate to pad interconnects in semiconductor devices. In one embodiment, a method of forming a device is disclosed. A substrate with a circuits component and a dielectric layer with interconnects is provided. A pad level dielectric layer is formed over the dielectric layer. A primary passivation layer is formed over the pad level dielectric layer with pad interconnects. The substrate is subjected to an alloying process. During the alloying process, the primary passivation layer prevents or reduces formation of hillocks on surfaces of the pad interconnects to improve surface smoothness of the pad interconnects. Pad openings are formed in the pad level dielectric layer to expose top surfaces of the pad interconnects. A cap dielectric layer is formed on the substrate and lines the primary passivation layer as well as the exposed top surfaces of the pad interconnects. A final passivation layer is formed on the substrate and covers the cap dielectric layer. The final passivation layer is patterned to form final passivation openings corresponding to the pad openings.

In another embodiment, another method of forming a device is disclosed. A substrate prepared with a circuits component and a dielectric layer with interconnects is prepared. A pad level dielectric layer is formed over the dielectric layer. Pad interconnects are formed in the pad level dielectric layer. Top surfaces of the pad interconnects are coplanar with a top surface of the pad level dielectric layer. A dielectric etch stop liner on the pad level dielectric layer is formed. The etch stop liner covers the top surfaces of the pad interconnects. A primary passivation layer is formed over the pad level dielectric layer with the pad interconnects. The substrate is subjected to an alloying process. During the alloying process, the primary passivation layer prevents or reduces formation of hillocks on the top surfaces of the pad interconnects to improve surface smoothness of the pad interconnects. Pad openings are formed in the primary passivation layer. Forming the pad openings removes exposed portions of the etch stop liner to expose the top surfaces of the pad interconnects. A cap dielectric later is formed on the substrate and lines the primary passivation layer as well as the exposed top surfaces of the pad interconnects. A final passivation layer is formed on the substrate and covers the cap dielectric layer. The final passivation layer is patterned to form final passivation openings corresponding to the pad openings.

In yet another embodiment, a device is disclosed. The device includes a substrate prepared with a circuits component and a dielectric layer with interconnects. A pad level dielectric layer with pad interconnects is disposed over the dielectric layer. A primary passivation layer is disposed over the pad dielectric layer with the pad interconnects. A final passivation layer is disposed over the primary passivation layer. The device further includes pad openings in the primary and final passivation layers corresponding to the pad interconnects. A cap dielectric layer is disposed on top surfaces of the pad interconnects in the pad openings. The top surfaces of the pad interconnects include improved surface smoothness due to the primary passivation layer undergoing high temperature processes which prevents or reduces formation of hillocks on surfaces of the pad interconnects.

These and other advantages and features of the embodiments herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

The accompanying drawings, which are incorporated in and form part of the specification in which like numerals designate like parts, illustrate preferred embodiments of the present disclosure and, together with the description, serve to explain the principles of various embodiments of the present disclosure.

FIGS. 3a-3h show simplified cross-sectional views of an embodiment of a process for forming a device.

DETAILED DESCRIPTION

Embodiments generally relate to devices, for example, semiconductor devices or integrated circuits (ICs). More particularly, embodiments relate to forming pad interconnects in ICs. The ICs can be any type of ICs, such as dynamic or static random access memories, signal processors, microcontrollers or system-on-chip (SoC) devices. Other types of devices may also be useful. The devices or ICs can be incorporated into or used with, for example, consumer electronic products, or other types of products.

The fabrication of devices may involve the formation of features on a substrate that make up circuit components, such as transistors, resistors and capacitors. The devices are interconnected, enabling the IC to perform the desired functions. To form the features and interconnections, layers are repeatedly deposited on the substrate and patterned as desired using lithographic techniques. For example, a wafer is patterned by exposing a photoresist layer with the pattern on a reticle with an exposure source. After exposure, the photoresist layer is developed, where the pattern of the reticle is transferred to the photoresist, and a photoresist etch mask is created. An etch is performed using the etch mask to replicate the pattern on the wafer below, which may include one or more layers, depending on the stage of the process. In the formation of an IC, numerous reticles may be used for different patterning processes. Furthermore, a plurality of ICs may be formed on the wafer in parallel.

Figure 1:
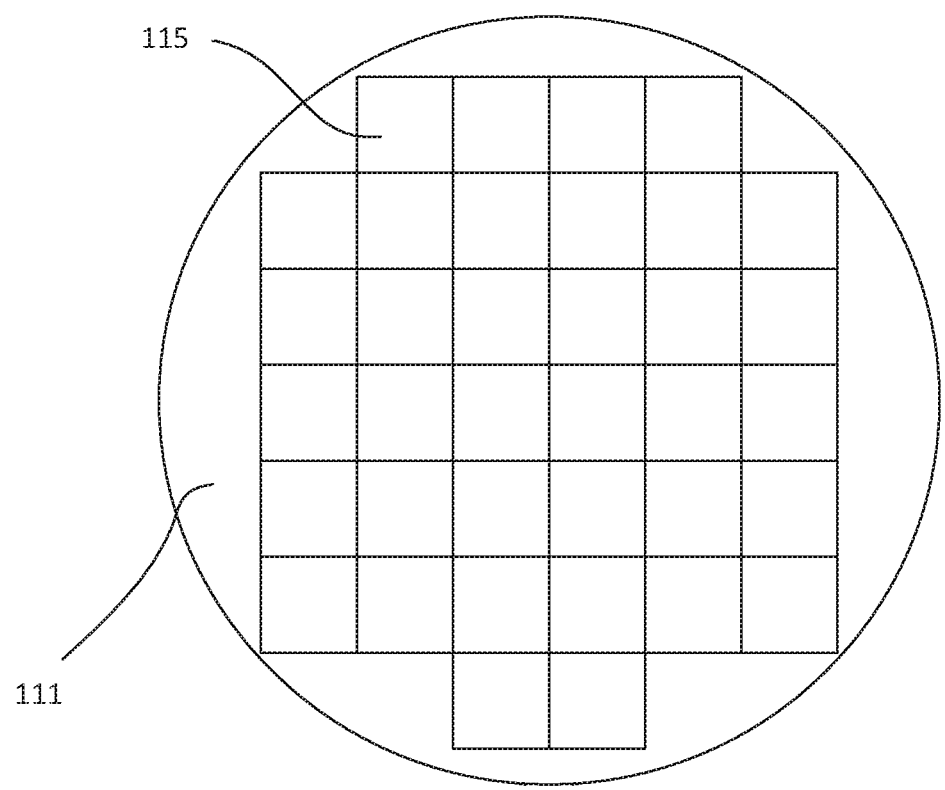
FIG. 1 shows a top view of a semiconductor wafer.

FIG. 1 shows a simplified plan view of an embodiment of a semiconductor wafer 101. The semiconductor wafer, for example, may be a silicon wafer. The wafer may be a lightly doped p-type wafer. Other types of wafers, such as silicon-on-insulator (SOI), or silicon germanium wafer as well as doped with other types of dopants or dopant concentrations may also be useful.

The wafer includes an active surface 111 on which devices 115 are formed. A plurality of devices may be formed on the wafer in parallel. The devices, for example, are arranged in rows along a first (x) direction and columns along a second (y) direction. Separating the devices are dicing channels. When the process is completed, the wafer is diced along the dicing channels to singulate the devices into individual chips.

Figure 2:
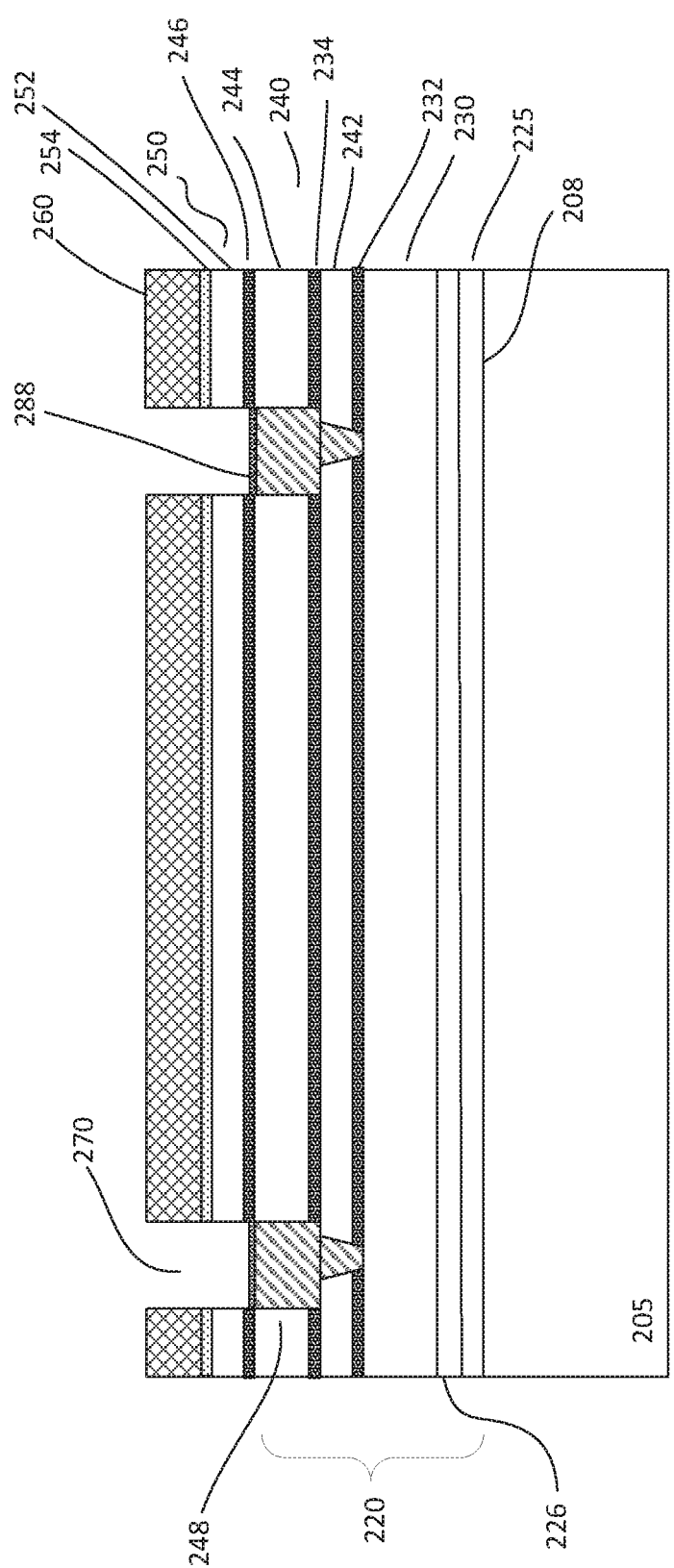
FIG. 2 shows a simplified cross-sectional view of an embodiment of a device.

FIG. 2 shows a simplified embodiment of a device 115. The device, for example, is an integrated circuit (IC). Other types of devices may also be useful. The device, for example, may be formed in parallel on a wafer and subsequently singulated. The device includes a substrate 205. The device, for example, may be a part of the wafer, as described in FIG. 1. Common elements may not be described or described in detail. The substrate, for example, may be a semiconductor substrate, such as a silicon substrate. Other types of substrates or wafers may also be useful.

The substrate of the device may include various types of regions. Such regions, for example, may include high voltage (HV), low voltage (LV) and intermediate or medium voltage (MV) regions. High voltage devices or components are formed in the high voltage region, low voltage components are formed in the low voltage region and intermediate voltage components are formed in the intermediate voltage region. The components, for example, are metal oxide semiconductor (MOS) transistors. Other types of components or device regions may also be useful.

Front-end-of-line (FEOL) processing is performed on the substrate. For example, isolation regions are formed to isolate different device regions. The isolation regions, for example, are shallow trench isolation (STI) regions. Other types of isolation regions may also be useful. The isolation regions are provided to isolate device regions from other regions. Device wells are formed for p-type and n-type transistors for a complementary MOS (CMOS) device. Separate implants may be employed to form different doped wells using, for example, implant masks, such as photoresist masks. Gates of transistors are formed on the substrate. Gates are formed by, for example, gate oxide layer, such as thermal silicon oxide, followed by a gate electrode layer, such as polysilicon. The gate electrode may be doped. Other types of gate materials may also be useful. Separate processes may be performed for forming gate dielectrics of the different voltage transistors. This is due to, for example, different gate oxide thicknesses associated with the different voltage transistors. For example, a HV transistor will have a thicker gate dielectric than a LV transistor.

The gate layers, in one embodiment, may be formed on the active surface of the substrate 208. After the gate layers are formed on the active surface of the substrate 208, they are patterned to form gates. For example, a photoresist mask may be used for a reactive ion etch (RIE) to pattern the gate layers to form the gates. Source/drain (S/D) regions are formed adjacent to the gates. The S/D regions are heavily doped regions. Depending on the type of device, the S/D regions may be heavily doped n-type or p-type regions. For n-type transistors, S/D regions are heavily doped n-type regions and for p-type transistors, S/D regions are heavily doped p-type regions. Lightly doped regions may be provided for the S/D regions. Dielectric sidewall spacers may be provided on sidewalls of the gates to facilitate forming lightly doped regions. Separate implants may be employed to form different doped regions using, for example, implant masks, such as photoresist mask.

After forming transistors, back-end-of-line (BEOL) processing is performed. The BEOL process includes forming interconnects between interlevel dielectric (ILD) layers 220. The interconnects connect the various components of the IC to perform the desired functions. An ILD layer includes a metal level and a contact level. Generally, the metal level includes conductors or metal lines while the contact level includes contacts. The conductors and contacts may be formed of metal, such as copper, copper alloy, aluminum, tungsten or a combination thereof. Other suitable types of metals, alloys or conductive materials may also be useful. In some cases, the conductors and contacts may be formed of the same material. For example, in upper metal levels, the conductors and contacts may be formed by dual damascene techniques. This results in the conductors and contacts having the same material. In some cases, the conductors and contacts may have different materials. Forming the upper metal levels using single damascene techniques may also be useful. For example, in the case where the contacts and conductors are formed by single damascene techniques, the materials of the conductors and contacts may be different. Other techniques, such as reactive ion etch (RIE) may also be employed to form metal lines.

A device may include a plurality of ILD layers or levels 220. For example, x number of ILD levels may be provided. For example, 5 ILD levels (x=5) may be provided for the device. Other number of ILD levels may also be useful. The number of ILD levels may depend on, for example, design requirements or the logic processes involved. A metal level of an ILD level may be referred to as $M_i$, where i is the $i^{th}$ ILD level of x ILD levels. A contact level of an ILD level may be referred to as $V_{i-1}$, where i is the $i^{th}$ ILD level of x ILD levels. For the first contact level, it may be referred to as CA.

The BEOL process, for example, commences by forming a dielectric layer 225 over the transistors and other components formed in the FEOL process. The dielectric layer may be silicon oxide. For example, the dielectric layer may be silicon oxide formed by chemical vapor deposition (CVD). The dielectric layer serves as a pre-metal dielectric layer or the first contact layer of the BEOL process. The dielectric layer may be referred to as the CA level of the BEOL process. Contacts are formed in the CA level dielectric layer. The contacts may be formed by single damascene techniques. Via openings are formed in the dielectric layer using mask and etch techniques. For example, a pattern resist mask with openings corresponding to the vias is formed over the dielectric layer. An anisotropic etch, such as RIE, is performed to form the vias, exposing contact regions below, such as S/D regions and gates. A conductive layer, such as tungsten is deposited on the substrate, filling the openings. The conductive layer may be formed by sputtering. Other techniques may also be useful. A planarization process, such as chemical mechanical planarization (CMP), is performed to remove excess conductive material, leaving contact plugs in the CA level.

After forming contacts in the CA level, the BEOL process continues to form a dielectric layer 226 over the substrate, covering the CA level dielectric layer. The dielectric layer, for example, serves as the first metal level M1 of the first ILD layer. The dielectric layer, for example, is a silicon oxide layer. Other types of dielectric layers may also be useful. The dielectric layer may be formed by CVD. Other techniques for forming the dielectric layer may also be useful.

Conductive lines are formed in the M1 level dielectric layer. The M1 conductive lines may be formed by single damascene techniques. For example, the dielectric layer may be etched to form trenches or openings using, for example, mask and etch techniques. A conductive layer is formed on the substrate, filling the openings. For example, a copper or copper alloy layer may be formed to fill the openings. The conductive material may be formed by, for example, plating, such as electro or electroless plating. Other types of conductive layers or forming techniques may also be useful. The first metal level M1 and CA may be referred as a lower ILD level 225.

The process continues to form additional ILD layers. For example, the process continues to form upper ILD levels 230. The upper ILD levels may include ILD level 2 to ILD level x. For example, in the case where x=5 (5 levels), the upper levels include ILD levels from 2 to 5, which includes M2 to M5. The number of ILD layers depends on, for example, design requirements or the logic process involved. These ILD layers may be referred to as intermediate ILD layers. The intermediate ILD layers may be formed of silicon oxide. For example, the ILD layers may be TEOS ILD layers. Other types of dielectric materials, such as low k, high k or a combination of dielectric materials may also be useful. The ILD layers may be formed by, for example, CVD. Other techniques for forming the ILD layers may also be useful.

The conductors and contacts of the upper ILD layers may be formed by dual damascene techniques. For example, vias and trenches are formed, creating dual damascene structures. The dual damascene structure may be formed by, for example, via first or via last dual damascene techniques. Mask and etch techniques may be employed to form the dual damascene structures. The dual damascene structures are filled with a conductive layer, such as copper or copper alloy. The conductive layer may be formed by, for example, plating techniques. Excess conductive material is removed, forming conductors and contacts in the intermediate ILD layer. In other embodiments, the upper ILD layers may be formed by single damascene techniques. For example, in single damascene techniques, separate etch and fill processes are employed for the via and metal levels. Forming the upper ILD layers using a combination of single and dual damascene techniques may also be useful. For example, one or more upper levels may be formed by single damascene techniques while others are formed by dual damascene techniques.

A dielectric liner 232 may be disposed between ILD levels, on the substrate. In some embodiments, a dielectric liner 234 may be disposed between a metal and a via level. The dielectric liner, for example, serves as an etch stop layer. The thickness of the dielectric liners may be about 200 Å. Other thicknesses may also be useful. The dielectric liners may be formed of a low k dielectric material. For example, the dielectric liners may be nBLOK. Other types of dielectric materials for the dielectric liners may also be useful. It is understood that different dielectric liners need not to be formed of the same material.

The uppermost ILD level (e.g., x) may have different design rules, such as critical dimension (CD), than the lower ILD levels. For example, the top metal level Mx may have a larger CD than the lower metal levels M1 to Mx−1. For example, the uppermost or top metal level may have a CD which may be greater than 6× compared to the lower levels. The lower levels may be 1×, 2× or 6×. Other configurations of the lower levels may also be useful.

In one embodiment, the uppermost ILD level 240 serves as a pad level of the device. The pad level, for example, is a metal level 244 (Mx) disposed over a via level 242 (Vx−1). As shown, the dielectric liner 234 is provided between the metal and via levels. The metal level includes pad interconnects 248. In one embodiment Mx is an ultra-thick metal (UTM) level. For example, the pad interconnects are UTM pad interconnects. The UTM metal level may be much thicker than other metal levels. For example, the UTM metal level may be about 3 um thick while the non-UTM metal levels may be about 0.14 um-0.85 um thick. As an example, a 1× level may be about 0.14 um thick, a 2× level may be about 0.36 um thick and a 6× levels may be about 0.85 um thick. Other thicknesses may also be useful and may vary depending on the technology node. Via contacts may be provided in the via level which interconnect the pad interconnects with circuit components. The pad interconnects and via contacts may be formed using dual damascene or single damascene techniques. The pad interconnects and via contacts may be formed of copper or copper alloy. Other types of conductive materials of processes may be employed to form the pad interconnects and via contacts.

A dielectric liner 232, in one embodiment, is disposed between ILD levels, on the substrate. The dielectric liner, for example, serves as an etch stop layer. The thickness of the dielectric liners may be about 200 Å. Other thicknesses may also be useful. The dielectric liner may be formed of a low k dielectric material. For example, the dielectric liners may be nBLOK. Other types of dielectric materials for the dielectric liners may also be useful.

A primary passivation layer 250 is disposed over the pad level. For example, the primary passivation layer is disposed over the dielectric liner over the pad level. In one embodiment, the primary passivation layer is a stack having first and second passivation layers 252 and 254. The second passivation layer is disposed over the first passivation layer. In one embodiment, the first passivation layer is a silicon oxide layer while second passivation layer is a silicon nitride layer. Other types of passivation stacks may also be useful. The thickness of the first passivation layer may be about 4500 Å while the second passivation layer may also be about 4500 Å. Other thicknesses may also be useful. The passivation layer, for example serves to protect the device from cracking, oxidation, moisture as well as downstream processes. Other configurations of primary passivation layers may also be useful.

A final passivation layer 260 is disposed over the primary passivation layer. The final passivation layer, in one embodiment, includes a polyimide layer. The thickness of the final passivation layer may be about 5 um. Other thicknesses may also be useful. The final and primary passivation layers include pad openings 270 which correspond to pad interconnects in the pad level. As shown, two pad openings provided in the final and primary passivation layers correspond to the first and the second pad interconnects. However, it is understood that there may be other number of pad openings which may be located in different cross-section cuts of the device. The number of pad openings, for example, depends on the number of pad interconnects. The pad interconnects provide external connections to the device.

In one embodiment, a very thin cap dielectric liner 288 is disposed over the surface of the pad interconnects 248 in the pad opening. Forming the pad openings in the primary passivation layer may remove portions of the dielectric liner 246 which then exposes the surface of the pad interconnects. The cap dielectric liner may be formed over the substrate after the pad openings are formed. The cap dielectric liner may be a conformal dielectric layer which lines the surface of the primary passivation layer and pad opening. The thickness of the cap dielectric layer may be about 75 Å±25 Å. Other thicknesses may also be useful. The cap dielectric liner may be formed of a low k dielectric material. For example, the dielectric liners may be nBLOK. Other types of dielectric materials for the cap dielectric liner may also be useful. The final passivation layer may be disposed over the cap dielectric liner and patterned to form pad openings therein. In one embodiment, the cap dielectric liner remains over the surface of the pad interconnect. This prevents oxidation of the pad interconnects.

In one embodiment, the surface of the pad interconnects is relatively smooth compared to conventional devices. For example, in conventional devices, the surface of the pad interconnects is exposed to high temperature processes. For example, the surface of the pad interconnects are subjected to an alloying process at as over 400° C. for about 2 hours. Due to the high temperature exposure, hillocks are formed on the surface, increasing surface roughness. In one embodiment, size and density of hillocks on the surface of the pad interconnects are reduced or avoided by protecting the pad interconnects during the alloying process with the primary passivation layer without pad openings. Reducing or avoiding hillocks in the pad interconnects produces increased surface smoothness of the pad interconnects. This improves interconnect reliability. For example, downstream bonding process margin is increased to improve bonding reliability and chip package integrity.

Figure 3A:
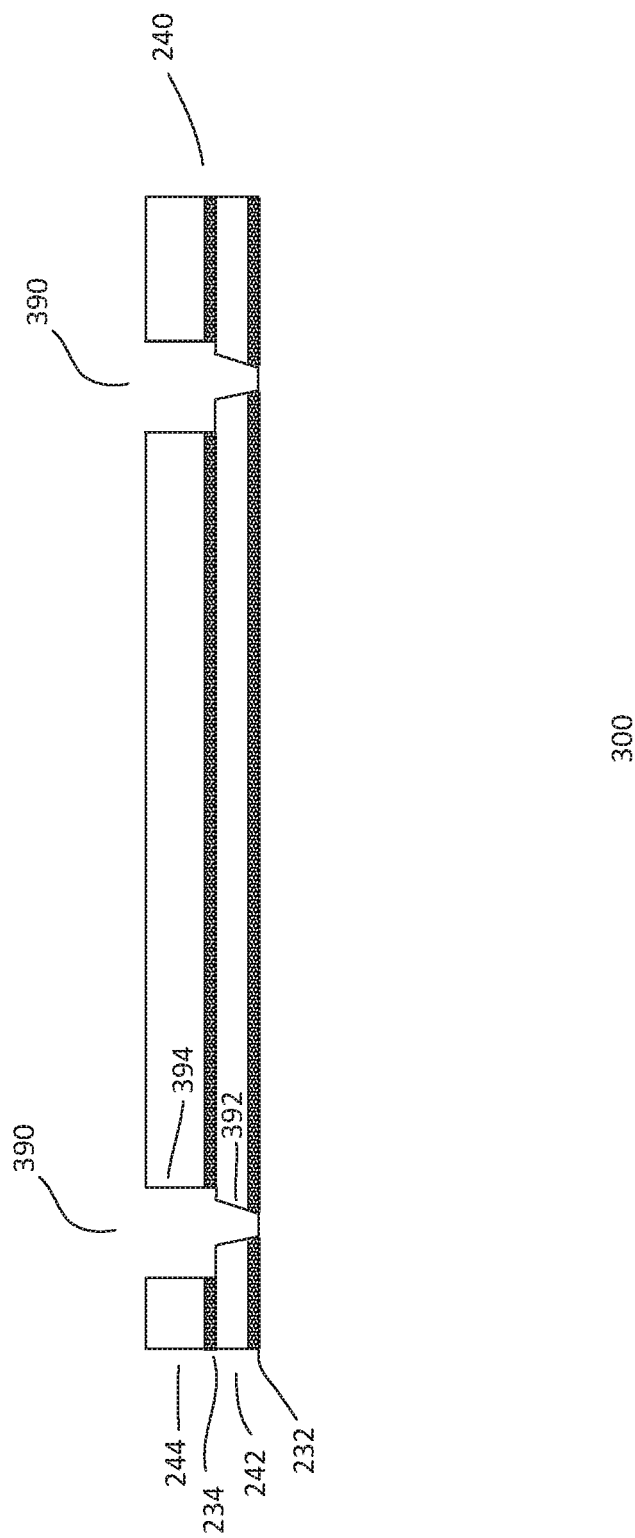

FIGS. 3a-3g show an embodiment of a process for forming a device 300. The process relates to the formation of pad interconnects in a device. Referring to FIG. 3a, a simplified portion of the device is shown. The device may be similar to that described in FIG. 2. Common elements may not be described or described in detail.

The device, for example, includes a substrate (not shown) with ILD levels. An uppermost ILD level 240 is shown. The uppermost ILD level, for example, includes an uppermost or top metal level 244 (Mx) with via level 242 (Vx−1). In the case where the device includes 5 metal levels, the uppermost metal level is M5 and the uppermost via level is V4. Other designations or number of metal levels may also be useful. The uppermost ILD level, as shown, includes dual damascene structures 390. A dual damascene structure includes a trench 394 in the metal level and a via 392 in the via level. The trench corresponds to the pad interconnect while the via level corresponds to a via contact which electrically couples the pad interconnect to input, output and input/output (I/O) components via lower ILD levels. In other embodiments, the uppermost ILD level may include single damascene structures. For example, the uppermost level includes single damascene structures while the via level includes filled vias (via contacts).

In FIG. 3b, a conductive layer 359 is formed on the substrate. For example, the conductive layer fills the dual damascene structures and covers the uppermost metal level Mx. In one embodiment, the conductive layer is copper of a copper alloy. The conductive layer may be formed by plating, such as electro plating. Other forming techniques may also be useful.

Figure 3C:
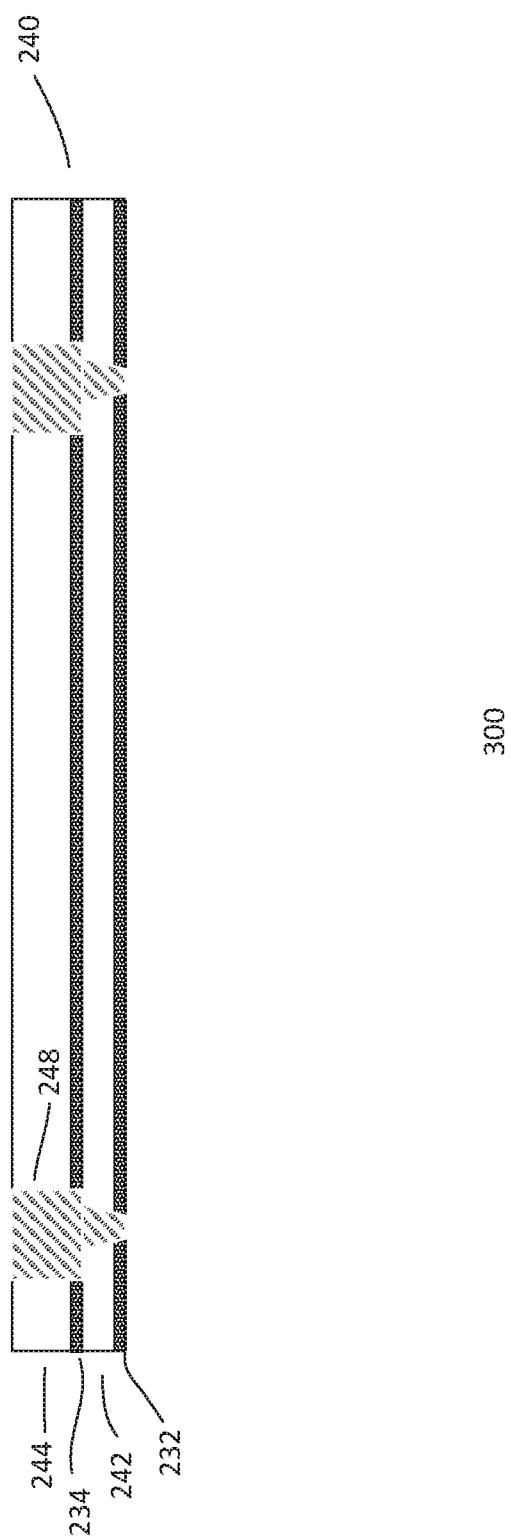

Referring to FIG. 3c, the substrate is planarized. In one embodiment, the substrate is planarized to remove excess conductive material; forming pad interconnects 248. As shown, the pad interconnects are coplanar with the uppermost ILD or pad level. Planarizing the substrate, in one embodiment, includes polishing the substrate surface. For example, chemical mechanical polishing (CMP) is employed to planarize the substrate surface. Other planarizing techniques may also be useful.

Figure 3D:
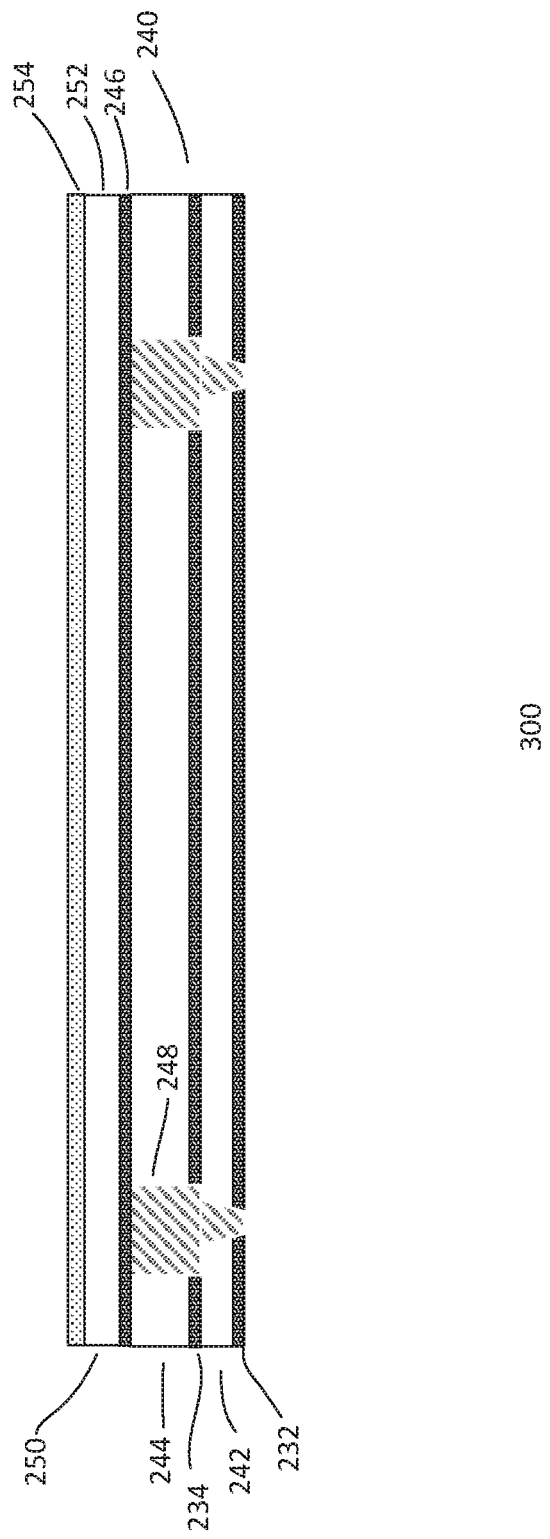

As shown in FIG. 3d, a cap dielectric liner 246, is formed on the substrate. For example, the cap liner is formed on the uppermost metal level over the pad interconnects. The dielectric liner may be a low k dielectric liner. For example, the dielectric liner may be nBLOK. The cap liner may be formed by chemical vapor deposition (CVD). Other types of dielectric materials or techniques to form the cap liner may also be useful.

A primary passivation layer 250 is formed on the substrate. The primary passivation layer is formed on the cap liner layer. In one embodiment, the primary passivation layer is a stack of multiple passivation layers. In one embodiment, the primary passivation layer includes a first passivation layer 252 and a second passivation layer 254. The first passivation layer is a silicon oxide layer and the second passivation layer is a silicon nitride layer. The passivation layers may be formed by CVD. Other configurations of passivation layers and forming techniques may also be useful.

Figure 3E:
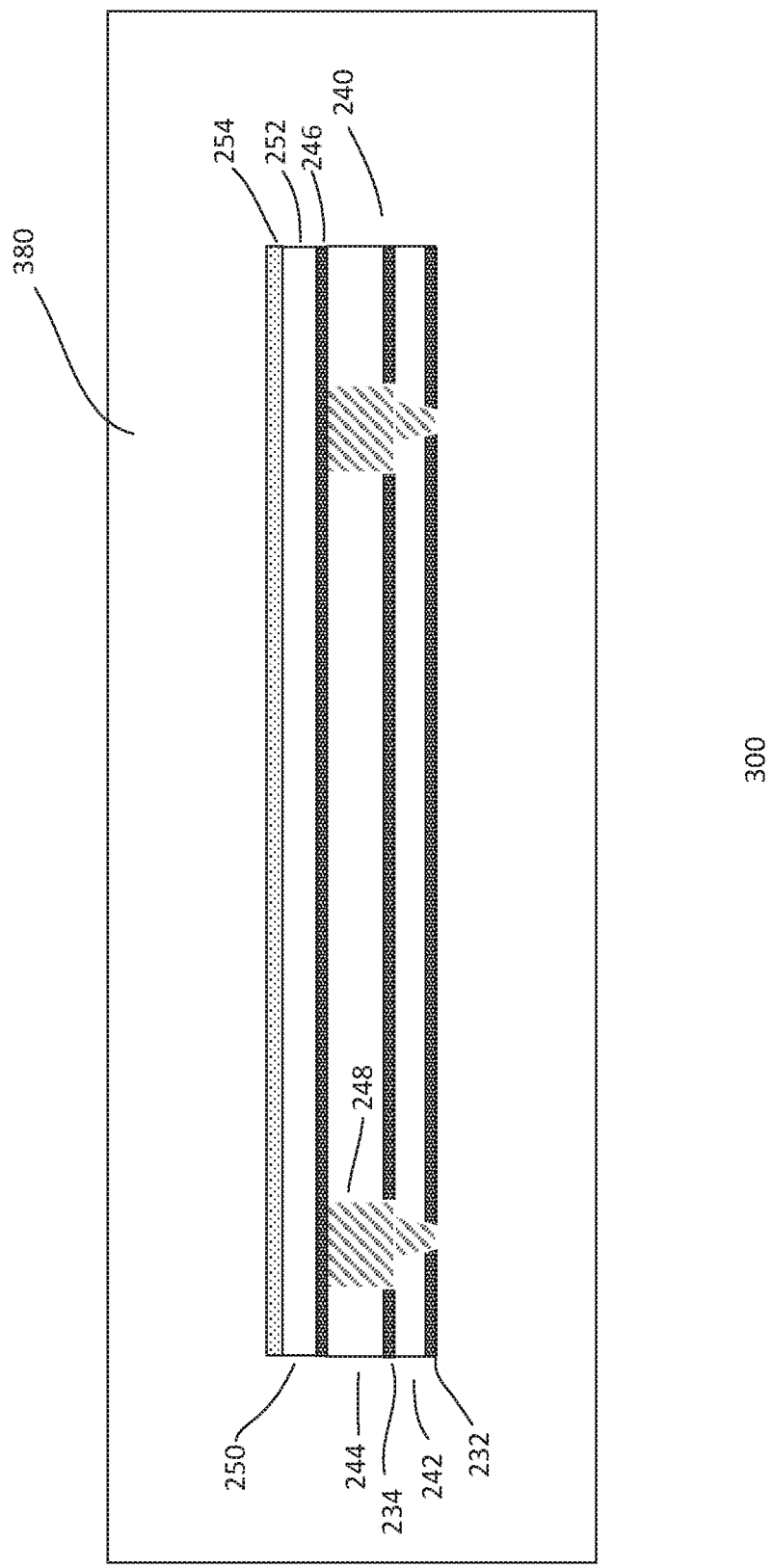

The substrate is subjected to an alloying process, as shown in FIG. 3e. The alloying process includes annealing the substrate in a furnace 380 in a hydrogen ambient at over 400° C. The substrate may be annealed for about 2 hours. Other annealing parameters for the alloying process may also be useful. The alloying process serves to improve device performance and reliability. For example, the alloying anneal repairs dangling bonds in the substrate.

As discussed, performing the alloying process with the primary passivation layer protecting the pad interconnects prevents or reduces formation of hillocks. For example, hillocks on the surface of the pad interconnects are avoided or reduced. This improves the reliability of the pad interconnects. For example, reducing or avoiding hillocks in the pad interconnects produces increased surface smoothness of the pad interconnects. This increases downstream bonding process margin to improve bonding reliability and chip package integrity.

Referring to FIG. 3f, pad openings 270 are formed in the primary passivation layer. The openings, for example, correspond to pad interconnects. For example, a patterned photoresist mask may be formed over the primary passivation layer, serving as an etch mask. An etch, such as RIE, may be performed to pattern the primary passivation layer using the patterned resist etch mask. In one embodiment, the etch transfers the pattern of the mask to the primary passivation layer. In one embodiment, the etch removes the primary passivation layer unprotected by the etch mask. The etch also removes the cap liner to expose the pad interconnects.

Figure 3G:
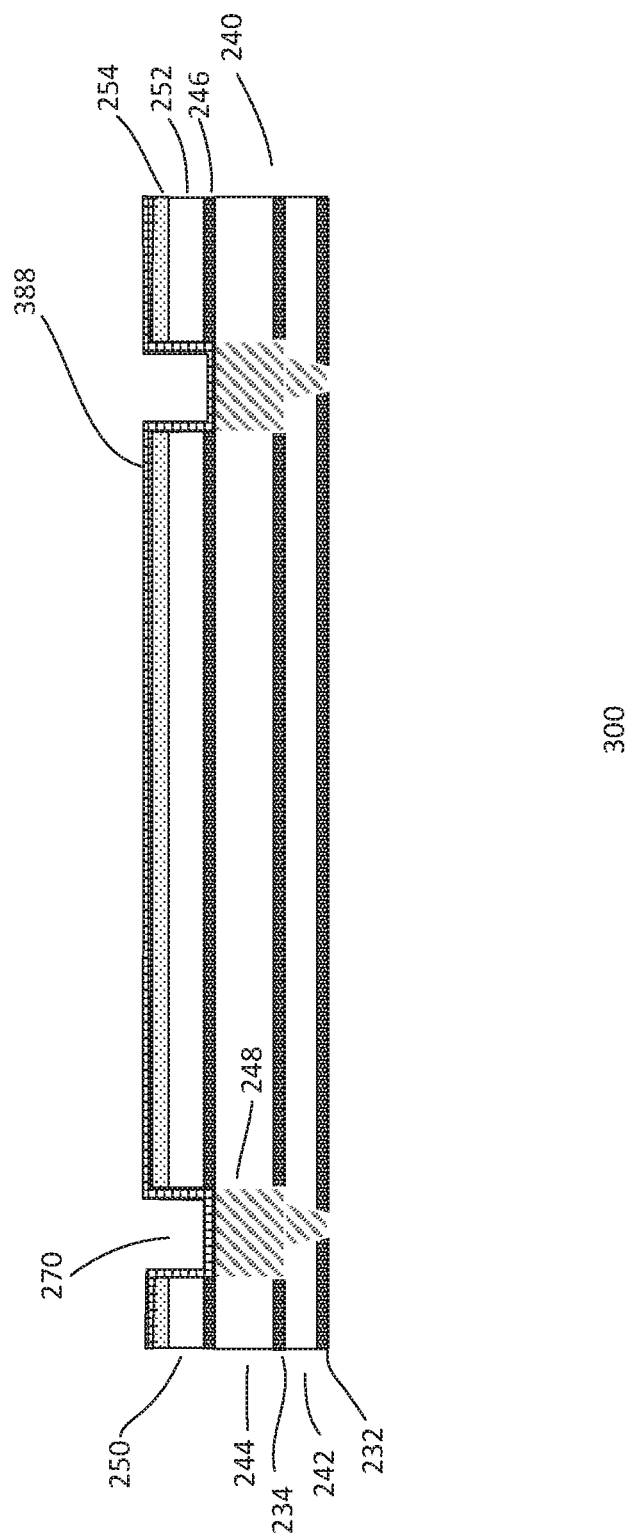

In one embodiment, a new or second cap liner 388 is formed on the substrate, as shown in FIG. 3g. The new cap liner, for example, may be similar to the cap liner 246. The new cap liner, for example, is formed using CVD, lining the passivation layer and the pad openings. The thickness of the new cap liner may be about 75 Å±25 Å thick. The cap liner protects the pad interconnects from oxidation. Furthermore, since the cap liner is sufficiently thin, it need not be removed to perform wire bonding. If necessary, the cap liner may be removed for subsequent packaging, such as wire bonding or wafer level bumping.

Figure 3H:
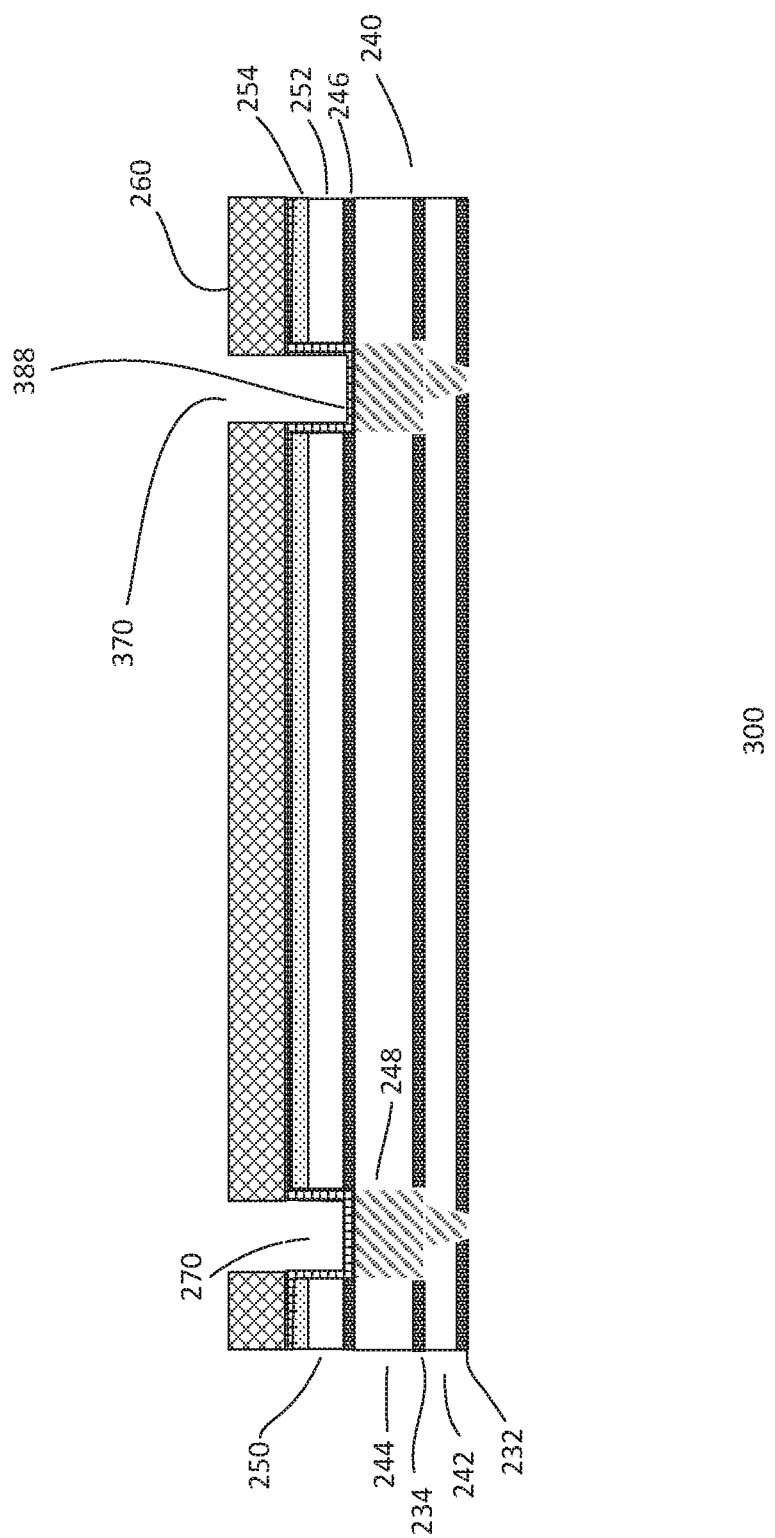

In FIG. 3h, a final passivation layer 260 is formed on the surface of the substrate. The final passivation layer, for example, is formed over the primary passivation layer. In one embodiment, the final passivation layer is a self-planarizing layer. For example, the final passivation layer is a polyimide layer formed by spin coating. In one embodiment, the final passivation layer is a photosensitive polyimide layer. Other types of final passivation layers may also be useful.

The final passivation layer is patterned to form pad interconnect openings 370 which correspond to the pad interconnects. Patterning the final passivation layer may be achieved by exposing it with an exposure source using the same mask as that used in forming the etch mask for the primary passivation layer. After exposure, the portions of the passivation layer corresponding to the pad interconnects are removed by a development process.

Additional processes may be performed to complete forming the device. For example, the wafer may be diced to singulate the devices for packaging. In one embodiment, wire bonding may be performed on the devices and packaged. Since the cap dielectric layer is sufficiently thin, it need not be removed for wire bonding. If necessary, the cap dielectric layer may be removed. In other embodiments, wafer level packaging may be performed. Similarly, if necessary, the cap dielectric layer may be removed for wafer level packaging. Subsequently, the wafer is diced to singulate the devices.

The present disclosure may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

The invention claimed is:

1. A method of forming a device comprising:
   providing a substrate prepared with a circuit component and a dielectric layer with interconnects;
   forming a pad level dielectric layer over the dielectric layer;
   forming pad interconnects in the pad level dielectric layer;
   forming a primary passivation layer over the pad level dielectric layer with the pad interconnects;
   subjecting the substrate to an alloying process, wherein the primary passivation layer prevents or reduces formation of hillocks on surfaces of the pad interconnects to improve surface smoothness of the pad interconnects;
   forming pad openings in the primary passivation layer to expose top surfaces of the pad interconnects;
   forming a cap dielectric layer on the substrate, the cap dielectric layer lines the primary passivation layer and the exposed top surfaces of the pad interconnects;
   forming a final passivation layer on the substrate, the final passivation layer covering the cap dielectric layer; and
   patterning the final passivation layer to form final passivation openings corresponding to the pad openings.

2. The method of claim 1 wherein the pad interconnects comprise copper pad interconnects.

3. The method of claim 1 wherein forming the pad interconnects comprises:
   forming dual damascene structures in the pad level dielectric layer;
   using copper to form a conductive layer on the substrate, the copper filling the dual damascene structures; and
   planarizing the substrate to remove excess copper and provide a coplanar surface with the pad level dielectric layer and the exposed top surfaces of the pad interconnects.

4. The method of claim 1 wherein forming the pad interconnects comprises:
   forming single damascene structures in the pad level dielectric layer;
   using copper to form a conductive layer on the substrate, the copper filling the single damascene structures; and
   planarizing the substrate to remove excess copper and provide a coplanar surface with the pad level dielectric layer and the exposed top surfaces of the pad interconnects.

5. The method of claim 1 comprises:
   forming an etch stop liner on the pad level dielectric layer and pad interconnects;
   forming the primary passivation layer on the etch stop liner; and
   wherein forming the pad openings also removes the etch stop liner to expose the top surfaces of the pad interconnects.

6. The method of claim 1 wherein forming the primary passivation layer comprises:
   forming a first dielectric layer; and
   forming a second dielectric layer over the first dielectric layer, the first and second dielectric layers form a primary passivation stack.

7. The method of claim 6 wherein:
   the first dielectric layer comprises silicon oxide; and
   the second dielectric layer comprises silicon nitride.

8. The method of claim 1 wherein the cap dielectric layer comprises nBLOK.

9. The method of claim 1 wherein the cap dielectric layer comprises a thickness of 75 Å±25 Å.

10. The method of claim 1 wherein:
    the final passivation layer comprises polyimide; and
    forming the final passivation layer comprises a spin-on process.

11. The method of claim 1 wherein the pad level dielectric layer comprises an ultra-thick metal (UTM) pad level.

12. A method of forming a device comprising:
    providing a substrate prepared with a circuit component and a dielectric layer with interconnects;
    forming a pad level dielectric layer over the dielectric layer;
    forming pad interconnects in the pad level dielectric layer, wherein top surfaces of the pad interconnects are coplanar with a top surface of the pad level dielectric layer;
    forming a dielectric etch stop liner on the pad level dielectric layer and covering the top surfaces of the pad interconnects;
    forming a primary passivation layer over the pad level dielectric layer with the pad interconnects;
    subjecting the substrate to an alloying process, wherein the primary passivation layer prevents or reduces formation of hillocks on the top surfaces of the pad interconnects to improve surface smoothness of the pad interconnects;
    forming pad openings in the primary passivation layer, wherein forming the pad openings removes exposed portions of the etch stop liner to expose the top surfaces of the pad interconnects;

forming a cap dielectric layer on the substrate, the cap dielectric layer lines the primary passivation layer and the exposed top surfaces of the pad interconnects;

forming a final passivation layer on the substrate, the final passivation layer covering the cap dielectric layer; and patterning the final passivation layer to form final passivation openings corresponding to the pad openings.

13. The method of claim 12 wherein forming the pad interconnects comprises:

forming dual damascene structures in the pad level dielectric layer;

using copper to form a conductive layer on the substrate, the copper filling the dual damascene structures; and planarizing the substrate to remove excess copper and to provide a coplanar surface with the pad level dielectric layer and the exposed top surfaces of the pad interconnects.

14. The method of claim 12 wherein forming the pad interconnects comprises:

forming single damascene structures in the pad level dielectric layer;

using copper to form a conductive layer on the substrate, the copper filling the single damascene structures; and planarizing the substrate to remove excess copper and provide a coplanar surface with the pad level dielectric layer and the exposed top surfaces of the pad interconnects.

15. The method of claim 12 wherein forming the primary passivation layer comprises:

forming a first dielectric layer; and forming a second dielectric layer over the first dielectric layer, the first and second dielectric layers form a primary passivation stack.

16. The method of claim 15 wherein:

the first dielectric layer comprises silicon oxide; and the second dielectric layer comprises silicon nitride.

17. The method of claim 12 wherein the pad level dielectric layer comprises an ultra-thick metal (UTM) pad level.

18. The method of claim 12 wherein the cap dielectric layer comprises a thickness of 75 Å±25 Å.

19. A method of forming a device comprising:

providing a substrate prepared with a circuit component, a dielectric layer and a pad level dielectric layer over the dielectric layer, wherein pad interconnects are provided in the pad level dielectric layer, the pad interconnects comprise top surfaces that are coplanar with a top surface of the pad level dielectric layer;

forming a primary passivation layer over the pad level dielectric layer provided with the pad interconnects; and subjecting the substrate to an alloying process, wherein the alloying process is performed with the primary passivation layer.

20. The method of claim 19 further comprises:

forming pad openings in the primary passivation layer to expose the top surfaces of the pad interconnects after the alloying process; and forming a final passivation layer on the substrate, wherein the final passivation layer includes passivation openings corresponding to the pad openings.

* * * * *